United States Patent [19]

Chambers

[11] Patent Number: 5,627,476

[45] Date of Patent: May 6, 1997

[54] MILLIOHM IMPEDANCE MEASUREMENT

[75] Inventor: Barbara L. Chambers, Scotts Valley, Calif.

[73] Assignee: Seagate Technology, Inc., Scotts Valley, Calif.

[21] Appl. No.: 496,845

[22] Filed: Jun. 27, 1995

[51] Int. Cl.$^6$ .................................................. G01R 27/16
[52] U.S. Cl. ........................... 324/704; 324/649; 324/691; 324/713
[58] Field of Search ................................. 324/649, 691, 324/704, 713, 715

[56] References Cited

U.S. PATENT DOCUMENTS

| | | | |
|---|---|---|---|
| 2,800,629 | 7/1957 | Tagg | 324/704 |
| 4,028,507 | 6/1977 | Hoppough | 324/715 X |
| 5,345,182 | 9/1994 | Wakamatsu | 324/649 |
| 5,463,323 | 10/1995 | Wakamatsu | 324/649 X |
| 5,469,071 | 11/1995 | Obata | 324/713 |

Primary Examiner—Maura K. Regan
Assistant Examiner—Glenn W. Brown
Attorney, Agent, or Firm—Edward P. Heller, III; Patrick T. King

[57] ABSTRACT

An impedance probe circuit and method presents a balanced load to a DC or RF voltage source and to two voltage measurement nodes. The impedance probe circuit is accurate for measurement of an impedance device X which has a range always less than the value of a characteristic impedance C. A source terminal is coupled to a voltage source having a series impedance C. A test resistor T is connected between the source terminal and one terminal X1 the unknown impedance. A reference resistor R is connected between the source terminal and the other terminal X2 of the unknown impedance. The parallel combination of the test resistor T and the reference resistor R has an impedance substantially equal to C/3. A third impedance of value C/3 is connected to the node X1 and to a first voltage measurement terminal. A fourth impedance of value C/3 is connected to the node X2 and to a second voltage measurement terminal. The voltage measurement terminals are respectively connected to ground through respective LOAD1 and LOAD2 resistors having values C. When the value of the test resistor T and the reference resistor R are properly chosen, the ratio of the voltages across LOAD1 and LOAD2 provides a measurement of the value of the unknown impedance. The sensitivity of the probe circuit in db per ohm is set by predeterminedly choosing the values of the reference resistor R and of the test resistor T.

21 Claims, 4 Drawing Sheets

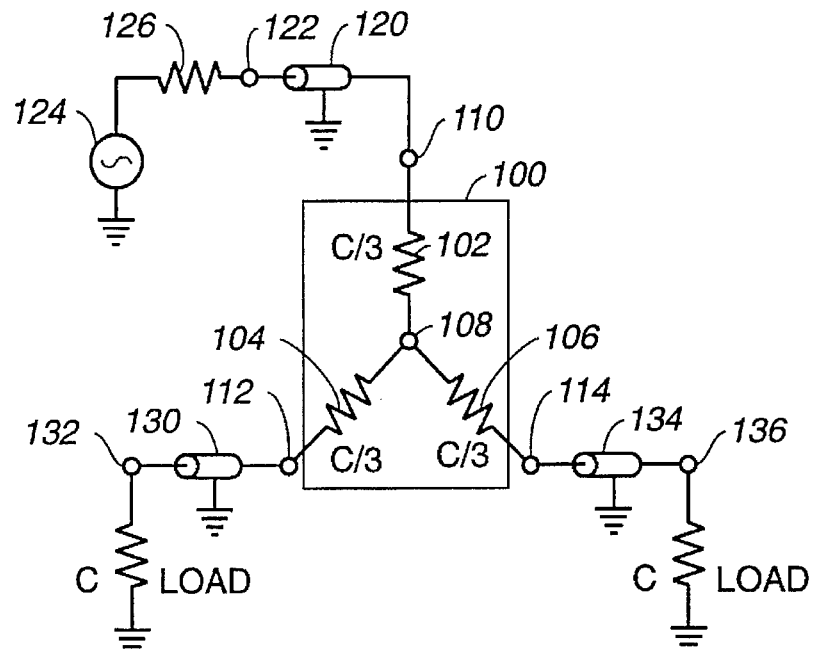
FIG._1
(PRIOR ART)
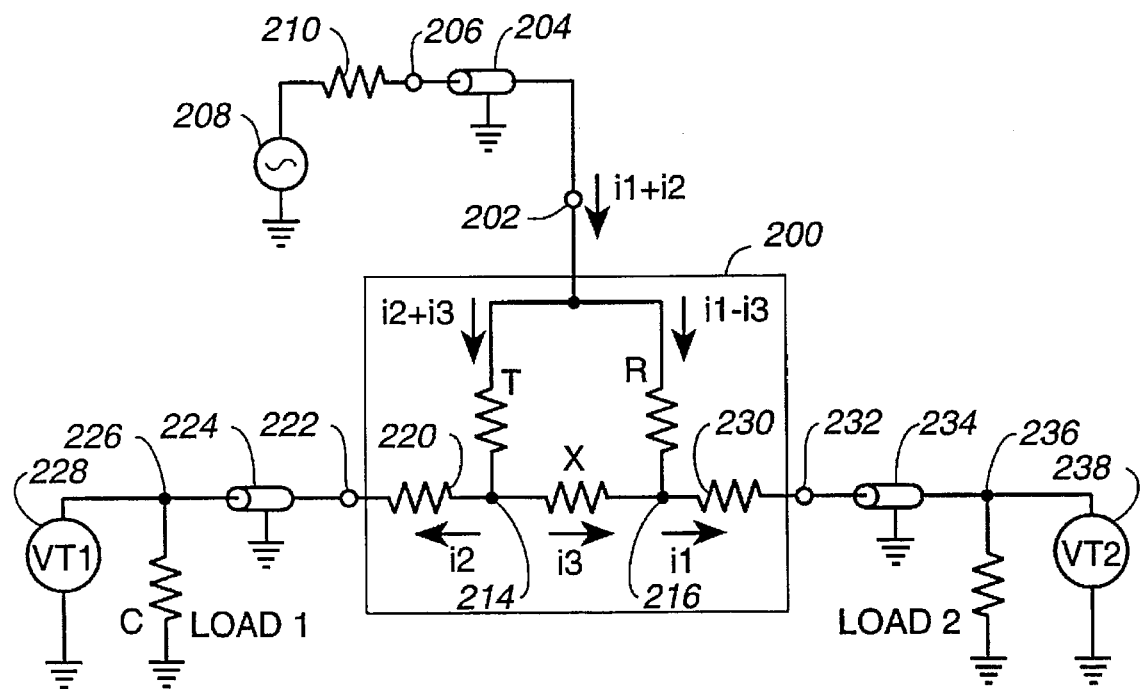
FIG._2

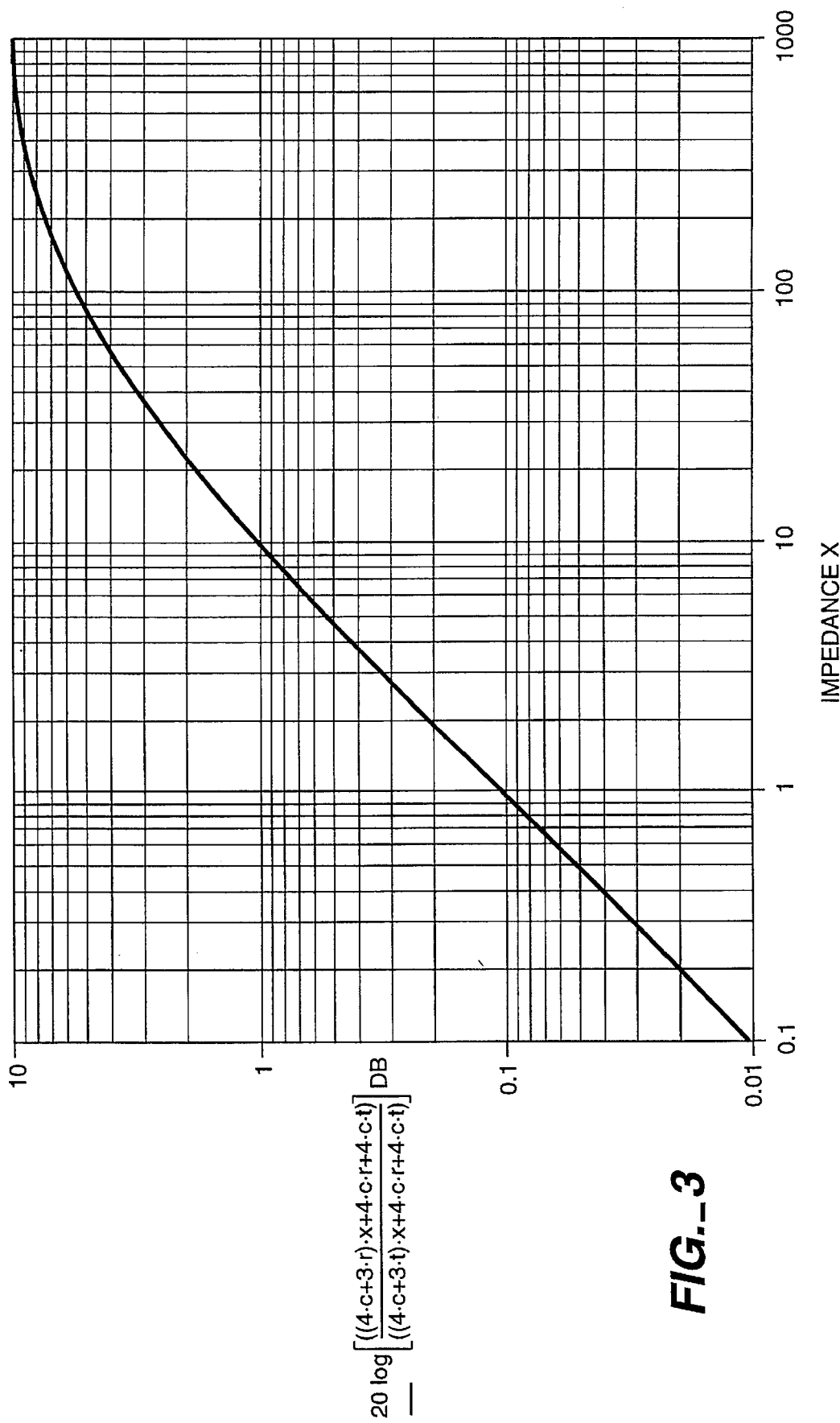
FIG._3

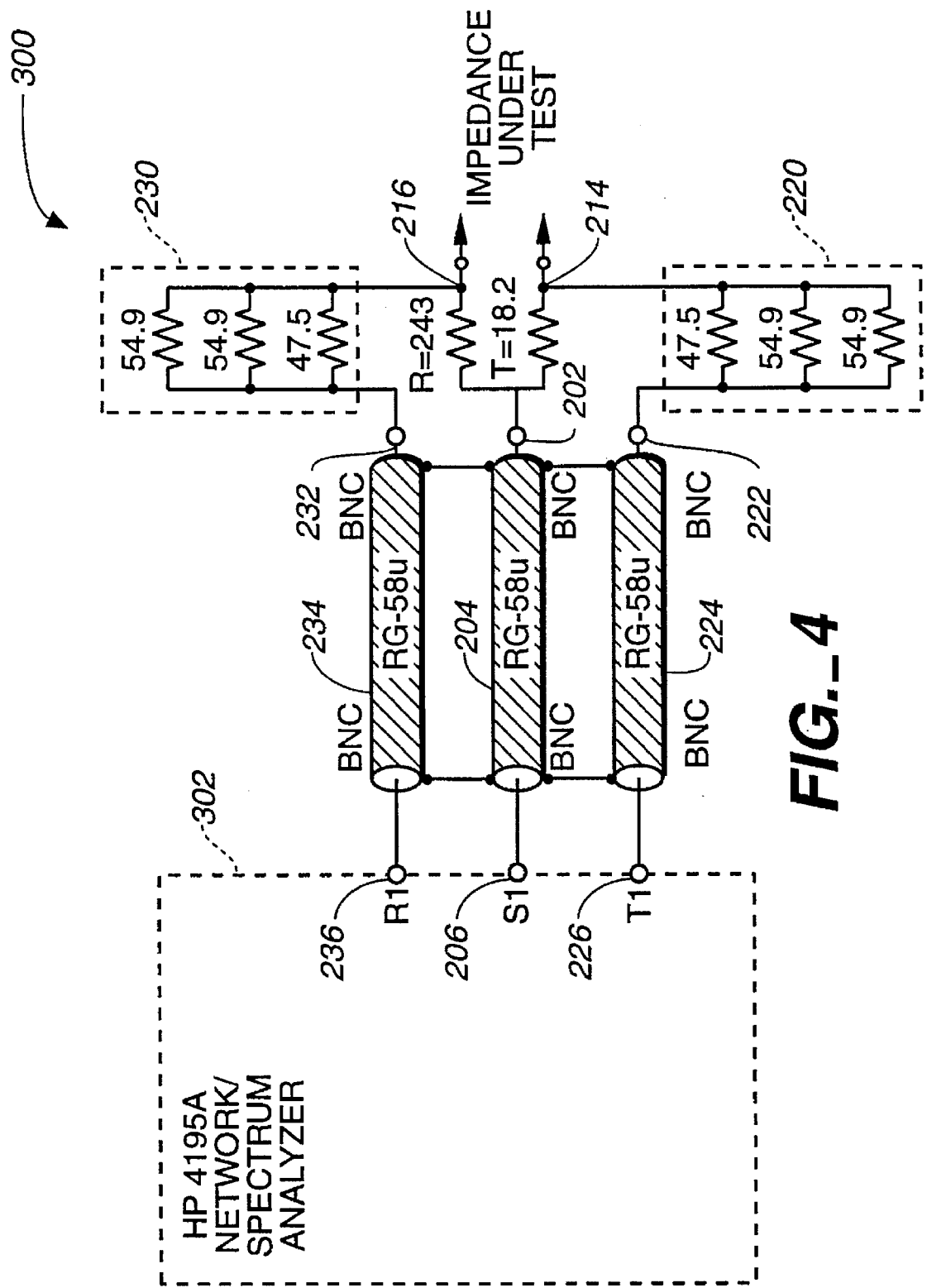
FIG._4

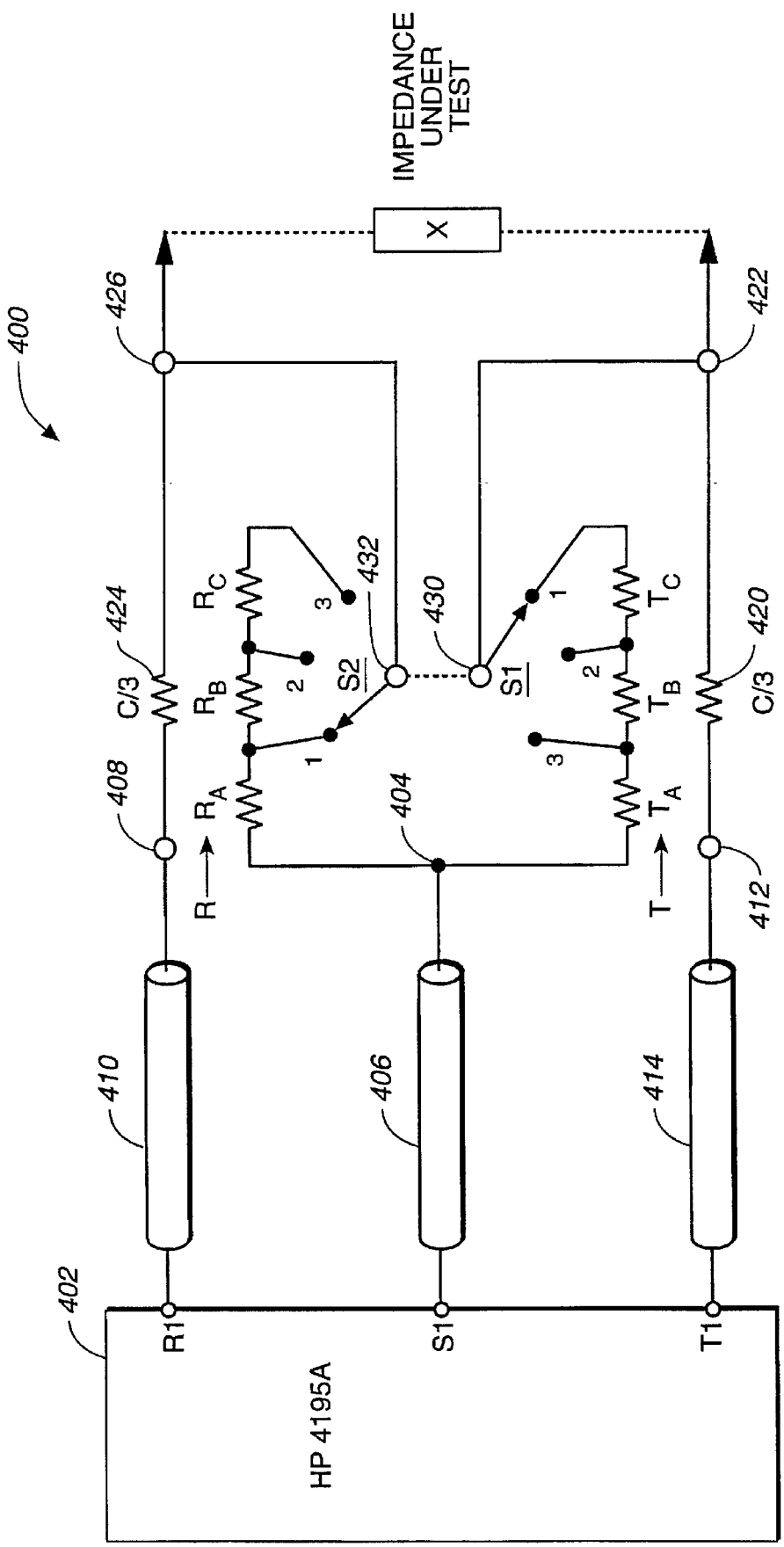
FIG._5

MILLIOHM IMPEDANCE MEASUREMENT

TECHNICAL FIELD

This invention relates to impedance measurements and, more particularly, to the measurement of low impedance values over a broad range of frequencies, DC to VHF.

BACKGROUND ART

One common way of measuring the impedance of a circuit device is by injecting a known current into the device and measuring the voltage across the device. For DC measurements, a constant current source is relatively easy to construct for making DC impedance measurements. However, a variable-frequency constant current source is difficult and expensive to construct.

A current source can be constructed from a voltage source and a series impedance, where the value of the series impedance is much greater than the impedance of a device to be measured. However, this approach attenuates the measurement signal so much that it is difficult to measure low impedance devices of less than 10 ohms. This approach places an unbalanced load on the end of an output signal line, such as, for example, a 50 ohm coaxial line, from the variable-frequency voltage source. The ground and shield currents which are generated by this unbalanced arrangement are often orders of magnitude greater than the signals measured across the impedance under test.

Expensive commercial test equipment is available for measuring impedances at frequencies above 100 kHz. One such test equipment arrangement provided by the Hewlett Packard Company employs an HP4195A network analyzer which is connected to an HP 41951A impedance test set. An impedance device under test is mounted to the relatively expensive test set. The impedance test set uses a current sampling inductive bridge transformer arrangement by which input current is sampled in a primary winding and a secondary winding provides an output voltage which is proportional to the input current. The network analyzer provides test input signals to the impedance test set. Connections are made from the impedance test set to the network analyzer to provide measurement signals for the network analyzer to calculate the value of an impedance device under test. The impedance test set is limited to operation above 100 kHz, so that low frequency or DC impedance measurements cannot be made with this arrangement. Besides the limitations in lower frequency measurements, the impedance test set is expensive. The network analyzer is very expensive.

Consequently, a need exists for a relatively low cost impedance measurement system which is capable of measuring very low impedance values from DC to RF frequencies.

SUMMARY OF THE INVENTION

An impedance probe according to the present invention is a passive, resistive network which presents balanced loads to a variable frequency voltage source and to a measurement instrument for impedances from 0 to 10 ohms from DC to RF frequencies.

The present invention provides an impedance probe for an impedance measuring system which permits detection of small variations in impedance because the signal source and measurement instruments sees balanced loads at all times. The impedance probe according to the invention is similar to a standard 50-ohm RF power splitter in that the invention also maintains proper termination impedances at each terminal. For example, an RF power splitter allows a source with a 50-ohm source impedance to be simultaneously connected to two 50 ohm loads while the load on the source remains at exactly 50 ohms. An impedance probe according to the invention also maintains proper termination impedances.

An impedance probe according to the invention provides two terminals for connection to the terminals of an unknown impedance device. The impedance probe includes a source node adapted for connection to a variable-frequency voltage source having a characteristic source impedance C.

The impedance probe includes a fixed-value test resistor T, which has a first terminal connected to the source node and which has a second terminal connected to a first test node X1. The first node X1 is adapted to being connected to one terminal of an unknown impedance device X.

The impedance probe also includes a fixed-value reference resistor R, which has a first terminal also connected to the source node 8 and which has a second terminal connected to a second test node x2. The second test node X2 is also adapted to being connected to the other terminal of the unknown impedance device X.

The parallel combination of the test resistor T and the reference resistor R has an impedance substantially equal to C/3.

The impedance probe also includes a third resistor, also having a value substantially equal to C/3, which has a first terminal connected to the first test node X1 and which has a second terminal connected to a voltage test terminal. A first load impedance LOAD 1 is connected between the test terminal and the reference voltage potential. The test terminal is adapted to having a first voltmeter connected thereto and to the reference voltage potential.

The impedance probe also includes a fourth impedance, also having an impedance substantially equal to C/3, which has a first terminal connected to the second test node X2 and which has a second terminal connected to a reference terminal. A second load impedance LOAD2 is connected between the reference terminal and the reference voltage potential. The reference terminal is adapted to having a second voltmeter connected thereto and to the reference voltage potential.

Mathematical derivations show that a set of resistance values exist for the test resistor T and the reference resistor R, which values cause the sensed voltage gain (expressed in db) to be exactly equal to 100 milliohms per db. The probe produces an exponential transfer function. When this exponential transfer function is expressed by a measurement instrument in db, it yields a linear measurement. Scalings other than 100 milliohms/db are also possible. The probe employs two resistors whose parallel combination is one third the impedance of the voltage source. The two resistors each have one end which receives the RF voltage signal from the voltage source. Their opposite ends form the electrical contacts for an impedance device under test. Two more resistors, each equal to one third the output impedance of the RF voltage source, each lead from one of the electrical contacts to a respective one of the two inputs of an RF voltage meter. With the proper choice of resistors, one embodiment of the probe provides a direct correspondence between the db scale commonly employed by an RF voltage meter and impedance value of 100 milliohm. That is, every 100 milliohm increase in the unknown impedance is displayed on an RF voltmeter as a 1 db increase in voltage.

In one embodiment of the invention the impedance probe uses a network analyzer as a voltage source and also as a voltage measuring instrument. The network analyzer measures the ratio of voltages. The resistance values for the test and reference resistors are chosen to provide a parallel combination resistance of 18 Ohm to maintain balanced loads. The resistance values for the test and reference resistors are also chosen to provide a relationship between the currents that yields a direct correspondence between 100 milliohm variations in the unknown impedance and a 1 db difference in the display of a reference voltmeter, such as that available in the network analyzer, which measures the ratio of voltages V2/V1 and which displays the results in db.

In another embodiment of the invention, a separate voltage source and separate RF voltmeters can be used, if desired.

Due to its simplicity of design, a probe provided according to the invention is compact and inexpensive to manufacture and use.

The invention provides a method of measuring the impedance of an unknown impedance device. The method includes the steps of connecting a first terminal of test resistor T having a first terminal connected to a source terminal S and connecting the second terminal of the test resistor T to a terminal X1, where terminal X1 is connected to a first terminal of an unknown impedance device X.

The method also includes the steps of connecting a first terminal of a reference resistor R to the source terminal S and connecting a second terminal of the reference resistor R to a terminal X2, where terminal X2 is connected to a second terminal of the unknown impedance device X.

The method also includes the steps of connecting one terminal of a third resistor, which has an impedance substantially equal to C/3, to the terminal X1 and coupling a first load impedance LOAD1 to another terminal of the third resistor. The method further includes the steps of connecting one terminal of a fourth resistor, which has an impedance substantially equal to C/3, to the terminal X2 and coupling a second load impedance LOAD2 to another terminal of the fourth resistor.

The values of a test resistor T and of a reference resistor R are selected such that the parallel combination of the test resistor T and the reference resistor R has an impedance value substantially equal to C/3 and selecting the values of the test resistor T and of the reference resistor R such that the ratio of the voltages across the first and the second load impedances LOAD1 and LOAD2 is proportional to the value of the unknown impedance X.

The method further includes applying a voltage from a voltage source having a series impedance C to the source terminal S; measuring the voltage across the first load impedance LOAD1;

The method also includes measuring the voltage across the second load impedance LOAD2; taking the ratio of the measured voltages across the first and the second load impedances LOAD1 and LOAD2; and providing the value of the unknown impedance X which is proportional to the ratio of the measured voltages.

BRIEF DESCRIPTION OF THE DRAWINGS

FIG. 1 is a schematic diagram of a conventional balanced power splitter, which is shown for reference.

FIG. 2 is a circuit diagram of a probe according to the invention.

FIG. 3 is a plot of db readings as a function of an unknown impedance x.

FIG. 4 is a schematic diagram of one embodiment of the invention.

FIG. 5 is a schematic diagram of another embodiment of the invention which uses switches to provide for several different db-per-ohm gain ratios.

DETAILED DESCRIPTION OF THE PREFERRED EMBODIMENTS

FIG. 1 shows a conventional balanced power splitter 100 for interconnection through cables having a characteristic impedance of C ohms to circuits having input impedances of C ohms. The conventional power splitter 100 is shown for purposes of illustrating that maintaining proper termination impedances at each terminal of a test probe is an important characteristic for a test probe which is used with RF frequencies and with coaxial cables. The power splitter 100 includes three star-connected resistors 102, 104, 106 which have resistance values C/3 and which all have one end connected to a common node 108. The other end of the resistor 102 is connected to an input terminal 110. The other end of the resistor 104 is connected to an output terminal 112. The other end of the resistor 106 is connected to an output terminal 114. The input terminal 110 of the power splitter 100 is connected through a coaxial cable 120 with a characteristic impedance $Z_o$ of C ohms to an output terminal 122 of a voltage source 124 having an equivalent series resistance 126 of C ohms. The output terminal 112 is connected through a transmission line 130 to a load terminal 132. A load impedance LOAD1 of C ohms is connected from the load terminal 132 and a ground reference potential. Similarly, the output terminal 114 is connected through a transmission line 134 to a load terminal 136. A load impedance LOAD2 of C ohms is connected from the load terminal 136 and the ground reference potential.

For a system with a nominal characteristic impedance of, for example, 50 ohms, the power splitter 100 allows a source with a 50-ohm source impedance to be simultaneously connected to two 50 ohm loads, while the load on the source remains at exactly 50 ohms. It should be appreciated that maintaining proper termination impedances at each terminal of a test probe is an important characteristic of a test probe which is used with RF frequencies and with coaxial cables.

FIG. 2 is a circuit model of an embodiment of an impedance probe circuit 200 which maintains proper input and output impedances according to the invention when the value of the unknown impedance X is small compared to the value of a characteristic impedance C. The impedance probe 200 is designed to provide impedance matching for a characteristic impedance C.

The impedance probe 200 includes a source node 202 which is adapted for connection through a coaxial cable 204, if required, to an output terminal 206 of a variable-frequency voltage source 208 having a series source impedance 210 of C ohms.

The impedance probe 200 also includes a fixed-value test resistor T, which has a first terminal connected to the source node 202 and which has a second terminal connected to a first test node 214. The first test node 214 is connected to one terminal of an unknown impedance device X. The impedance probe 200 also includes another fixed-value reference resistor R, which has a first terminal also connected to the source node 202 and which has a second terminal connected to a second test node 216. The second test node 216 is also adapted to being connected to the other terminal of the unknown impedance device X. The parallel combination of the test resistor T and the reference resistor R has an impedance substantially equal to C/3.

The impedance probe 200 also includes a third resistor 220 with a value substantially equal to C/3. The third resistor 220 has a first terminal connected to the first test node 214 and also has a second terminal connected to a test terminal 222. The test terminal 222 is connected through a coaxial cable 224 to a first test meter node 226 and a terminal of first load impedance LOAD 1. LOAD 1 has a value of C ohms and is connected between the first test meter node 226 and a ground, or reference voltage, potential. The first test meter node 226 is adapted to having a first voltmeter 228 connected between it and the ground reference voltage potential to measure a voltage VT1.

The impedance probe 200 also includes a fourth resistor 230 also with a value substantially equal to C/3. The fourth resistor 230 has a first terminal connected to the second test node 216 and also has a second terminal connected to a reference terminal 232. The reference terminal 232 is connected through a coaxial cable 234 to a second test meter node 236 and a second load impedance LOAD2. LOAD2 also has a value of C ohms and is connected between the second test meter node 236 and the ground, or reference voltage potential. The second test meter node 236 is adapted to having a second voltmeter 238 connected between it and the ground reference voltage potential to measure a voltage VT2.

Mathematical derivations herein below show that a set of resistance values exist for the test resistor T and the reference resistor R, which values cause the sensed voltage gain between VT1 and VT2 (expressed in db) to be exactly equal 1 ohm per 0.1 db. With this set of resistance values, the probe 200 produces an exponential transfer function. When this exponential transfer function is expressed by a measurement instrument in db, it yields a linear impedance measurement.

In one implementation of a probe according to the invention, the coaxial cables 204, 224 and 234 are RG-58 coaxial cables which has a characteristic impedance of 53 Ohms. In that case, the parallel combination of the test resistor T and the reference resistors R is 53/3=18 ohms, approximately.

Assume that the unknown impedance device X has a value of impedance which is equal to zero. That is, assume that first test node 214 and the second test node 216 are shorted together. For this case, the probe 200 acts as the balanced power splitter 100 of FIG. 1. An RF voltage introduced at the input terminal 206 of the coaxial cable 204 is evenly split between the cables 224 and 234 and all three cables are properly terminated.

The input terminal 202 is connected to an RF voltage source 208 having an equivalent series output impedance 210 of C ohms. An RF voltage source is provided by an HP4195A network/spectrum analyzer provided by the Hewlett Packard Company. The cables 224 and 234 are connected to Test and Reference voltmeter input terminals of the same network/spectrum analyzer.

For the circuit of FIG. 2, a current i flows through the fourth resistor 230. A current i2 flows through the third resistor 220. A current i3 flows through the unknown impedance device X. A current (i2+i3) flows through the test resistor T and a current (i1−i3) flows through the reference resistor R.

Since the network of FIG. 2 is planar with four nodes, we can define all currents with three independent current using Kirchoff's current law (KCL). Three voltage equation are then written using Kirchoff's voltage law (KVL) to define all voltages. These equations are sufficient to solve for all of the currents and to derive the voltages.

Applying KVL around the bottom loop of the network of FIG. 2, we obtain Equation 1.

$$i2 \cdot \left( c + \frac{c}{3} \right) - i3 \cdot x = i1 \cdot \left( c + \frac{c}{3} \right) \quad (1)$$

Solving for i1, i2, i3 gives:

$$i3 = \frac{\left( \frac{4}{3} \cdot i2 \cdot c - \frac{4}{3} \cdot i1 \cdot c \right)}{x}$$

$$i2 = \frac{-3}{4} \cdot \frac{\left( -i3 \cdot x - \frac{4}{3} \cdot i1 \cdot c \right)}{c}$$

$$i1 = \frac{3}{4} \cdot \frac{\left( \frac{4}{3} \cdot i2 \cdot c - i3 \cdot x \right)}{c}$$

Applying KVL around the loop defined by resisters T, R, X of the network of FIG. 2, we obtain Equation 2.

$$t \cdot (i2 + i3) - r \cdot i3 = r \cdot (i1 - i3) \quad (2)$$

Solving i1, i2, i3 gives:

$$i1 = \frac{(t \cdot i2 + t \cdot i3 + i3 \cdot x + r \cdot i3)}{r}$$

$$i2 = \frac{-(t \cdot i3 + i3 \cdot x - r \cdot i1 + r \cdot i3)}{t}$$

$$i3 = \frac{-(t \cdot i2 - r \cdot i1)}{(t + x + r)}$$

Applying KVL, around the loop defined by the voltage source v, T, and Load 1, we obtain Equation 3.

$$c \cdot (i1 + i2) + t \cdot (i2 + i3) + i2 \cdot \left( c + \frac{c}{3} \right) = v \quad (3)$$

Solving for i1, i2, and i3 gives:

$$i1 = \frac{-\left( \frac{7}{3} \cdot i2 \cdot c + t \cdot i2 + t \cdot i3 - v \right)}{c}$$

$$i2 = \frac{-(i1 \cdot c + t \cdot i3 - v)}{\left( \frac{7}{3} \cdot c + t \right)}$$

$$i3 = \frac{-\left( i1 \cdot c + \frac{7}{3} \cdot i2 \cdot c + t \cdot i2 - v \right)}{t}$$

Combining Equations 2 and 3 and eliminating i3 gives Equation 4:

$$\frac{-\left( i1 \cdot c + \frac{7}{3} \cdot i2 \cdot c + t \cdot i2 - v \right)}{t} = \frac{-(t \cdot i2 - r \cdot i1)}{(t + x + r)} \quad (4)$$

Solving for i2 gives:

$$i2 = -3 \cdot \frac{(i1 \cdot c \cdot t + i1 \cdot c \cdot x + i1 \cdot c \cdot r - v \cdot t - v \cdot x - v \cdot r + r \cdot i1 \cdot t)}{(7 \cdot c \cdot t + 7 \cdot c \cdot x + 7 \cdot c \cdot r + 3 \cdot t \cdot x + 3 \cdot t \cdot r)}$$

Combining Equations 1 and 3 and eliminating i3 gives Equation 5:

$$\frac{-\left(i1 \cdot c + \frac{7}{3} \cdot i2 \cdot c + t \cdot i2 - v\right)}{t} = \frac{\left(\frac{4}{3} \cdot i2 \cdot c - \frac{4}{3} \cdot i1 \cdot c\right)}{x} \quad (5)$$

Solving for i2 gives:

$$i2 = \frac{-(3 \cdot i1 \cdot c \cdot x - 3 \cdot v \cdot x - 4 \cdot i1 \cdot c \cdot t)}{(7 \cdot c \cdot x + 3 \cdot t \cdot x + 4 \cdot c \cdot t)}$$

Solving for i1 using Equations 4 and 5 gives:

$$\frac{-(3 \cdot i1 \cdot c \cdot x - 3 \cdot v \cdot x - 4 \cdot i1 \cdot c \cdot t)}{(7 \cdot c \cdot x + 3 \cdot t \cdot x + 4 \cdot c \cdot t)} = 3 \cdot \frac{(i1 \cdot c \cdot t + i1 \cdot c \cdot x + i1 \cdot c \cdot r - v \cdot t - v \cdot x - v \cdot r + r \cdot i1 \cdot t)}{(7 \cdot c \cdot t + 7 \cdot c \cdot x + 7 \cdot c \cdot r + 3 \cdot t \cdot x + 3 \cdot t \cdot r)}$$

This gives for i1:

$$i1 = 3 \cdot v \cdot \frac{(4 \cdot c \cdot x + 3 \cdot t \cdot x + 4 \cdot c \cdot t + 4 \cdot c \cdot r)}{(40 \cdot c^2 \cdot x + 21 \cdot x \cdot c \cdot r + 40 \cdot c^2 \cdot t + 40 \cdot c^2 \cdot r + 21 \cdot x \cdot c \cdot t + 24 \cdot r \cdot c \cdot t + 9 \cdot x \cdot t \cdot r)}$$

Using i2 from equation 5, gives i2:

$$i2 = \frac{3 \cdot (4 \cdot c \cdot x + 3 \cdot x \cdot r + 4 \cdot c \cdot r + 4 \cdot c \cdot t) \cdot v}{(40 \cdot c^2 \cdot x + 21 \cdot x \cdot c \cdot r + 40 \cdot c^2 \cdot t + 40 \cdot c^2 \cdot r + 21 \cdot x \cdot c \cdot t + 24 \cdot r \cdot c \cdot t + 9 \cdot x \cdot t \cdot r)}$$

The ratio of i2 (test) to i1 (reference) is:

$$\frac{3 \cdot (4 \cdot c \cdot x + 3 \cdot x \cdot r + 4 \cdot c \cdot r + 4 \cdot c \cdot t) \cdot \frac{v}{(40 \cdot c^2 \cdot x + 21 \cdot x \cdot c \cdot r + 40 \cdot c^2 \cdot t + 40 \cdot c^2 \cdot r + 21 \cdot x \cdot c \cdot t + 24 \cdot r \cdot c \cdot t + 9 \cdot x \cdot t \cdot r)}}{3 \cdot v \cdot \frac{(4 \cdot c \cdot x + 3 \cdot t \cdot x + 4 \cdot c \cdot t + 4 \cdot c \cdot r)}{(40 \cdot c^2 \cdot x + 21 \cdot x \cdot c \cdot r + 40 \cdot c^2 \cdot t + 40 \cdot c^2 \cdot r + 21 \cdot x \cdot c \cdot t + 24 \cdot r \cdot c \cdot t + 9 \cdot x \cdot t \cdot r)}}$$

This simplifies to an expression for gain i2/i1:

$$\text{gain} = \frac{((4 \cdot c + 3 \cdot r) \cdot x + 4 \cdot c \cdot r + 4 \cdot c \cdot t)}{((4 \cdot c + 3 \cdot t) \cdot x + 4 \cdot c \cdot r + 4 \cdot c \cdot t)}$$

The HP4195A display this ratio in db, so that gain expressed in this fashion is given by Equation 6:

$$db = 20 \cdot \log\left[\frac{((4 \cdot c + 3 \cdot r) \cdot x + 4 \cdot c \cdot r + 4 \cdot c \cdot t)}{((4 \cdot c + 3 \cdot t) \cdot x + 4 \cdot c \cdot r + 4 \cdot c \cdot t)}\right] \quad (6)$$

Equation 6 has a natural log-log proportion when X<C. By proper selection of the resistors R and T, Equation 6 provides a 1 to 10 ratio of resistance to db gain.

The characteristic impedance C for an RG-58 cable is approximately 53 ohms. C/3 is the expected 3-way power splitter impedance. C/3=17.8 ohms.

Differentiating the db equation (6) with respect to x:

$$\frac{d}{dx} 20 \cdot \log\left[\frac{((4 \cdot c + 3 \cdot r) \cdot x + 4 \cdot c \cdot r + 4 \cdot c \cdot t)}{((4 \cdot c + 3 \cdot t) \cdot x + 4 \cdot c \cdot r + 4 \cdot c \cdot t)}\right]$$

gives the following equation for db per ohm, with algebraic simplifications not shown:

$$240 \cdot c \cdot \frac{(r^2 - t^2)}{((4 \cdot x \cdot c + 3 \cdot x \cdot t + 4 \cdot c \cdot r + 4 \cdot c \cdot t) \cdot ((4 \cdot x \cdot c + 3 \cdot x \cdot r + 4 \cdot c \cdot t + 4 \cdot c \cdot t) \cdot (\ln(2) + \ln(5))))} \quad (7)$$

Assume that we wish a specific value of db per ohm, such as 0.10. We also assume that x is small compared to r, t, and c. By setting the above equation equal to 0.10 and giving x the value of 0 and c the value of 53, we get an equation in R and T. First, we substitute for x and c:

$$240 \cdot 53 \cdot \frac{(r^2 - t^2)}{((4 \cdot 53 \cdot r + 4 \cdot 53 \cdot t) \cdot ((4 \cdot 53 \cdot r + 4 \cdot 53 \cdot t) \cdot (\ln(2) + \ln(5))))}$$

which is simplified to $$\frac{15}{53} \cdot \frac{(r - t)}{((\ln(2) + \ln(5)) \cdot (r + t))} \quad (8)$$

This is then set to 0.1 to give:

$$\frac{15}{53} \cdot \frac{(r - t)}{((\ln(2) + \ln(5)) \cdot (r + t))} = 0.1 \quad (9)$$

We have shown that the parallel combination of R and T must always be C/3:

$$\frac{r \cdot t}{r + t} = \frac{53}{3} \quad (10)$$

Solving for R and T, we get R equals 189.536 ohms and T=19.483 ohms.

$$\text{Find}(r, t) = \begin{pmatrix} 189.536 \\ 19.483 \end{pmatrix}$$

In summary, we can see that for a sensitivity of 0.1 db per ohm, using a 53 ohm transmission lines and matched sources, the value of R is 190 ohms. The value of T is approximately 19 ohms. The sensitivity is set to be most accurate for values of X which are close to zero.

In this manner, a designer chooses a ranges of X over which accuracy is best. A sensitivity is chosen. The value of R and T are then derived.

FIG. 3 is a graph which shows a db reading, which is the ratio of the absolute value of the Test voltage to the absolute value of the Reference voltage, as a function of the total unknown resistance value x of FIG. 2.

FIG. 4 shows one preferred embodiment of an impedance probe assembly 300 according to the invention, where the same reference characters are used for elements shown in FIG. 2. This embodiment of a probe assembly uses RG-58 coaxial cable which has a characteristic impedance of 53 ohms. Using one percent precision resistors, the value of resistor R is set to 243 ohms and the value of resistor T is set to 18.2 ohms. A parallel combination of one percent resistors having values of 47.5, 54.9 and 54.9 ohms are also selected to produce the desired C/3 resistance value for resistors 220 and 230.

A Hewlett Packard HP4195A network/spectrum analyzer 302 is used with the impedance probe as a combination voltage source and measurement instrument. The source node 202 of the probe circuit is coupled through the cable 204 to the terminal 206, which is connected to the signal-source terminal S1 of the network/spectrum analyzer 302. The second voltage measurement node 232 is coupled through the cable 234 to terminal 236 which is connected to the reference input voltage terminal R1 of the network/spectrum analyzer 302. The second voltage measurement node 222 is coupled through the cable 224 to terminal 226 which is connected to the test input voltage terminal T1 of the network/spectrum analyzer 302.

The network/spectrum analyzer 302 measures the ratio of voltages $V_{226}$ to $V_{236}$. The resistors T and R maintain substantially balanced loads at the terminals 202, 222, 232 while providing a relationship between the voltages $V_{226}$ to $V_{236}$ that yields a direct correspondence between 1 ohm variations in the unknown impedance and a 0.1 db difference in the display of the reference voltmeters provided in the HP4195A, which measures the ratio of voltages $V_{226}$ to $V_{236}$ and displays the result in db. Alternatively, low-cost RF measurement instruments may be used in place of the HP4195A.

The impedance probe provided according to the invention is a passive, non-reactive device, low cost device which has a number of applications for measurement of impedances of less than 10 ohms. The present invention permits detection of small variations in impedance because the measuring instruments see balanced loads. The impedance probe provided according to the invention is useful in applications requiring accurate measurement of RF impedances over a range of 0 to 10 ohms, using low-cost instruments, if desired.

An impedance probe according to the present invention is particularly useful for measuring bypass capacitors on a printed circuit board (PCB) to which are mounted integrated or other circuit devices. The bypass capacitors are connected between a power-distribution printed trace on the PCB and a ground plane or ground trace on the PCB. The bypass capacitors are mounted near integrated circuits to provide a very low impedance path to ground and thereby protect the power-distribution traces from the effects of switching transients produced by digital integrated circuits switching states. Bypass capacitors provide an important function in the operation of a high-speed digital switching circuit. Unfortunately, there are a variety of mechanisms which reduce the effectiveness of a bypass capacitor. The layout of the power or ground lines may be improperly designed, a bypass capacitor may be improperly specified, deceptively manufactured, damaged during handling, or deceptively assembled between the power and ground line through, for example, a cold solder joint.

The impedance probe according to the invention is used to make an in-circuit measurement of the amplitude of the impedance of a bypass capacitor. This measurement is made by sweeping a signal around the operational frequency of an integrated circuit to determine if the integrated circuit is being properly bypassed at the operational frequency. The impedance being measured may be on the order of 100 milliohms. A defective bypass capacitor may produce a resonance impedance of 1 ohm at or near the operating frequency of the integrated circuit.

The impedance probe according to the invention is used to measure the series resonance of a crystal. For example, measurement of the impedance of a quartz crystal at 25 MHz. gives a gain reading of 0.2 db on the HP 4595A network analyzer, which indicates that the absolute value of the impedance of the crystal is 2 ohms.

The fact that an impedance probe according to the invention produces an exponential transfer function, which when expressed by a measurement, instrument in db provides a linear measurement is an important feature of the impedance probe.

FIG. 5 shows an embodiment of impedance probe circuit 400 according to the invention, which uses switches to provide for several different db-per-ohm gain ratios. This embodiment is similar to that of FIG. 4 with the addition of R and T being stepwise variable to provide for different gain ratios in terms of db per ohm. A Hewlett Packard HP4195A network/spectrum analyzer 402 is used with the impedance probe as a combination voltage source and measurement instrument.

A source node 404 of the impedance probe circuit 400 is coupled through a cable 406 to the signal-source terminal S1 of the network/spectrum analyzer 402. A voltage measurement node 408 is coupled through a cable 410 to a reference input voltage terminal R1 of the network/spectrum analyzer 402. A second voltage measurement node 412 is coupled through a cable 414 to the test input voltage terminal T1 of the network/spectrum analyzer 402. The coaxial cables 406, 410, and 414 have a characteristic impedance of C ohms.

The impedance probe circuit 400 also includes a third resistor 420 with a value substantially equal to C/3, which is connected between node 412 and a test terminal 422. The impedance probe circuit 400 also includes a fourth resistor 424 also with a value substantially equal to C/3, which is between node 408 and a second test node 426. An unknown impedance under test X is connected between the test terminals 422 and 426.

The impedance probe circuit 400 also uses switches arranged to provide for several different db-per-ohm gain ratios. The value of the test resistance T is provided between the source node 404 and test terminal 422 using a string of series connected resistors $T_A$, $T_B$, $T_C$. Similarly the value of the reference resistance R is provided between the source node 404 and test terminal 426 using a string of series connected resistors $R_A$, $R_B$, $R_C$.

A switch S1 has its contact-arm terminal 430 connected to the test terminal 422. An output terminal i of switch S1 is connected to one end of the resistor $T_C$. An output terminal 2 of switch S1 is connected to the junction of resistors $T_C$ and $T_B$. An output terminal 3 of switch S1 is connected to the junction of resistors $T_B$ and $T_A$. Similarly a switch S2 has its contact-arm terminal 432 connected to the test terminal 426. An output terminal 3 of switch S2 is connected to one end of the resistor $R_C$. An output terminal 2 of switch S12 is connected to the junction of resistors $R_C$ and $R_B$. An output terminal 1 of switch S1 is connected to the junction of resistors RB and RA. The switches S1 and S2 are ganged together such that terminals 1 of each switch each are engaged by their respective contact arms in position 1 and similarly for respective switch positions 2 and 3.

As illustrated in FIG. 5, three switch positions provide for three different gains in terms of db per ohm. When the switches are in position 1, reference resistance R is equal to $R_A$ and test resistance T is equal to $T_A+T_B+T_C$. When the switches are in position 2, reference resistance R is equal to RA+RB and test resistance T is equal to $TA+T_B$. When the switches are in position 3, reference resistance R is equal to $R_A+R_B+R_C$ and test resistance T is equal to $T_A$. The gain value is picked and the gain equation and the equation for the parallel combination of R and T set equal to C/3 are solved for values of R and T for each gain value.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. For example, other characteristic impedances can be accommodated. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

I claim:

1. An impedance probe circuit having two terminals for connection to the terminals of an unknown impedance device and for measurement of the value of the unknown impedance device, the impedance probe circuit comprising:

a source terminal S, adapted to having a voltage source with a series impedance C coupled thereto;

a test resistor T having a first terminal connected to the source terminal S and having a second terminal connected to a terminal X1, where terminal X1 is adapted to having a first terminal of an unknown impedance device X connected thereto;

a reference resistor R having a first terminal connected to the source node S and having a second terminal connected to a terminal X2, where terminal X2 is adapted to having a second terminal of the unknown impedance device X connected thereto;

a third resistor, which has an impedance substantially equal to C/3, which has a first terminal connected to the terminal X1, and which has a second terminal connected to a first voltage test terminal;

a first load impedance LOAD1 coupled to the first voltage test terminal;

a fourth resistor, which has an impedance substantially equal to C/3, which has a first terminal connected to the terminal X2, and which has a second terminal connected to a second voltage test terminal;

a second load impedance LOAD2 coupled to the second voltage test terminal;

wherein the values of the test resistor T and of the reference resistor R are selected such that the parallel combination of the test resistor T and the reference resistor R has an impedance value substantially equal to C/3 and wherein the values of the test resistor T and of the reference resistor R are selected such that the ratio of the voltages across the first and the second load impedances LOAD1 and LOAD2 is proportional to the value of the unknown impedance X.

2. The impedance probe circuit of claim i wherein the voltage source with a series impedance C is coupled to the source terminal S of the impedance probe circuit using coaxial cables having a characteristic impedance C.

3. The impedance probe circuit of claim 2, wherein the voltmeters provide a ratio of measured voltages in db and wherein the ratio of measured voltages in db is proportional to the impedance value of the unknown impedance device.

4. The impedance probe circuit of claim 1 wherein the first voltage test terminal is adapted to having a first voltmeter connected thereto and to a reference voltage potential and wherein the second voltage test terminal is adapted to having a second voltmeter connected thereto and to the reference voltage potential and wherein the first and second voltmeters measure the ratio of voltages across the first and the second load impedances LOAD1 and LOAD2.

5. The impedance probe circuit of claim 1 wherein the first load impedance LOAD1 is coupled through a coaxial cable with a characteristic impedance to the first voltage test terminal and wherein the second load impedance LOAD2 is coupled through a coaxial cable with a characteristic impedance to the second voltage test terminal.

6. The impedance probe circuit of claim 5, wherein a voltage ratio of 1 db is equivalent to 10 ohms of unknown impedance device as measured by the impedance probe circuit.

7. The impedance probe circuit of claim 1 wherein the unknown impedance device has a range of values X, where X<C.

8. The impedance probe circuit of claim 7, wherein C is a nominal 50 ohms, wherein the test first resistor T equals 243 ohms, wherein the reference resistor R equals 18.2 ohms, and wherein the gain in db per ohm has a value of 0.1.

9. The impedance probe circuit of claim 1, wherein the values of the test resistor T and the reference resistor R are selected to provide a predetermined voltage ratio in db which corresponds to the value of the unknown impedance device in ohms.

10. The impedance probe circuit of claim 1, wherein the probe presents a substantially balanced load to the voltage source and to the voltmeters.

11. The impedance probe circuit of claim 1, wherein a network analyzer serves as a voltage source and provides a voltmeter for voltage measurements.

12. The impedance probe circuit of claim 1 wherein ganged switches switchably provide predetermined sets of values of the reference resistor R and of the test resistor T to provide correspondingly different db-per-ohm gain ratios.

13. A method of measuring the impedance of an unknown impedance device, comprising the steps of:

connecting a first terminal of test resistor T to a source terminal S;

connecting the second terminal of the test resistor T to a terminal X1, where terminal X1 is connected to a first terminal of an unknown impedance device X;

connecting a first terminal of a reference resistor R to the source terminal S;

connecting a second terminal of the reference resistor R to a terminal X2, where terminal X2 is connected to a second terminal of the unknown impedance device X;

connecting one terminal of a third resistor, which has an impedance substantially equal to C/3, to the terminal X1;

coupling a first load impedance LOAD1 to another terminal of the third resistor;

connecting one terminal of a fourth resistor, which has an impedance substantially equal to C/3, to the terminal X2;

coupling a second load impedance LOAD2 to another terminal of the fourth resistor;

selecting the values of a test resistor T and of a reference resistor R such that the parallel combination of the test resistor T and the reference resistor R has an impedance value substantially equal to C/3 and selecting the values of the test resistor T and of the reference resistor R such that the ratio of the voltages across the first and the second load impedances LOAD1 and LOAD2 is proportional to the value of the unknown impedance X;

applying a voltage from a voltage source having a series impedance C to the source terminal S;

measuring the voltage across the first load impedance LOAD1;

measuring the voltage across the second load impedance LOAD2;

taking the ratio of the measured voltages across the first and the second load impedances LOAD1 and LOAD2; and providing the value of the unknown impedance X which is proportional to the ratio of the measured voltages.

14. The method of claim 13 wherein the step of applying a voltage from a voltage source having a series impedance C to the source terminal S includes applying said voltage through coaxial cables having a characteristic impedance C.

15. The method of claim 13 wherein the step of coupling a first load impedance LOAD1 to another terminal of the third resistor and the step of coupling a second load impedance LOAD2 to another terminal of the fourth resistor includes using coaxial cable for coupling.

16. The method of claim 13 wherein the step of measuring the voltage across the first load impedance LOAD1 and the step of measuring the voltage across the second load impedance LOAD2 includes providing a ratio of the measured voltages in db, where the ratio in db is proportional to the impedance value of the unknown impedance device.

17. The method of claim 16 wherein a voltage ratio of 1 db is equivalent to 10 ohms of unknown impedance device.

18. The method of claim 16 wherein the unknown impedance device has a range of values X, where X<C.

19. The method of claim 13 including selecting the values of the test resistor T and the reference resistor R to provide a predetermined voltage ratio in db which corresponds to the value of the unknown impedance device in ohms.

20. The method of claim 13 including using a network analyzer as a voltage source and as a voltmeter for voltage measurements.

21. The method of claim 13 including the step of switchably providing predetermined sets of values of the reference resistor R and of the test resistor T to provide correspondingly different db-per-ohm gain ratios.

* * * * *